(12) United States Patent
Watanabe

(10) Patent No.: US 6,395,997 B1
(45) Date of Patent: May 28, 2002

(54) FLAT CIRCUIT WITH CONNECTOR

(75) Inventor: Hiroshi Watanabe, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/642,882

(22) Filed: Aug. 22, 2000

(30) Foreign Application Priority Data

Aug. 24, 1999 (JP) .......................................... 11-236609

(51) Int. Cl.$^7$ .............................. H05K 1/16; H05K 1/00
(52) U.S. Cl. ...................... 174/260; 174/254; 439/82; 439/84
(58) Field of Search .............................. 174/254, 117 F, 174/117 FF, 261, 260; 439/82, 55, 84; 361/749, 826, 750, 751

(56) References Cited

U.S. PATENT DOCUMENTS

| | | | | |
|---|---|---|---|---|
| 3,079,577 A | * | 2/1963 | Brownfield | .................. 439/55 |
| 3,882,264 A | * | 5/1975 | Travis | ......................... 174/254 |
| 5,199,879 A | * | 4/1993 | Kohn et al. | .................... 439/82 |
| 5,587,890 A | * | 12/1996 | Happ et al. | ................. 361/826 |

FOREIGN PATENT DOCUMENTS

| | | |
|---|---|---|
| JP | 6-168765 | 6/1994 |
| JP | 10-152000 | 6/1998 |
| JP | 2000-207944 | 7/2000 |

* cited by examiner

Primary Examiner—Kamand Cuneo
(74) Attorney, Agent, or Firm—Armstrong, Westerman & Hattori, LLP

(57) ABSTRACT

In a flat circuit comprising a plurality of flexible conductors 27 and an insulating covering 28, there is formed a free end 25 which is elastically deformable in an engaging direction of connectors. A connector 24 adapted to be engaged with a connector 37 of an auxiliary component 26 is mounted on a conductor exposing part 32 in the free end 25. The flat circuit may be bent at a position of a desired length L so as to form the free end 25 at a side including an end edge 23.

4 Claims, 3 Drawing Sheets

FLAT CIRCUIT WITH CONNECTOR

BACKGROUND OF THE INVENTION

1. Field of the Invention

The present invention relates to a flat circuit arranged in a vehicle such as an automobile.

2. Description of the Related Art

FIG. 5 shows a flat circuit 1 in Japanese Patent Application No. 11-5315 which was filed by the Applicant on Jan. 12, 1999.

The above described flat circuit 1 has been proposed as a circuit structure which can be easily fitted to a vehicle body of an automobile or the like, and has a high allowability of wiring pattern. The flat circuit 1 includes a plurality of electric wires 2 as conductors and an insulating covering 3 in a strip shape which is formed of resin material covering the electric wires 2 by insert molding.

A plurality of the electric wires 2 are flexible and arranged in parallel to one another. The insulating covering 3 has at least on a front face side a plurality of conductor exposing windows 4 through which the electric wires 2 are exposed. The conductor exposing windows 4 are provided at an equal distance in a wiring direction of the electric wires 2.

Accordingly, the flat circuit 1 is so constructed that the flat circuit 1 is deformable along a configuration of the above described vehicle body or the like by bending the electric wires 2, and an electric power, for example, can be branched to various places through the conductor exposing windows 4.

Reference numeral 5 designates reinforcing members respectively provided on both sides of the insulating covering 3 for preventing the electric wires 2 from being damaged when the flat circuit 1 is bent many times.

However, in case where an auxiliary component is electrically connected from outside through an engaging hole formed in an instrument panel, after the flat circuit 1 is arranged inside the instrument panel in the vehicle, for example, there have been such drawbacks as described below.

In case where the auxiliary component is coupled to the flat circuit 1 by means of a connector of the auxiliary component (mating connector), a shortage of engagement in coupling with the flat circuit 1 must be prevented, and the auxiliary component must be pushed in beyond an engaging stroke of the connector. Accordingly, there has been a fear that the flat circuit 1 or the instrument panel may be broken or damaged especially in case where the flat circuit 1 is rigidly mounted inside the instrument panel.

The present invention has been made in view of the above described circumstances, and it is an object of the invention to provide an improved flat circuit which can be reliably connected to the mating connector.

SUMMARY OF THE INVENTION

In order to solve the above described problem, there is provided, according to the present invention, a flat circuit which comprises a plurality of flexible conductors which are arranged in parallel to one another, an insulating covering in a shape of a strip formed of insulating material so as to cover a plurality of the conductors by insert molding and extending in a direction of wiring the conductors, the flat circuit being deformable by bending the conductors, a plurality of conductor exposing parts provided on at least either one of a front face and a rear face of the insulating covering at desired distances in the wiring direction, through which the conductors are adapted to be exposed, a free end formed at one end of the flat circuit and extending for a desired length from an end edge in the wiring direction so as to be elastically deformable in a direction perpendicular to the wiring direction, and a connector provided on at least one of the conductor exposing parts located in the free end so that a mating connector can be engaged with the connector in the perpendicular direction.

According to a second aspect of the invention, the flat circuit is bent and deformed at a position of the desired length so as to form the free end at a side including the end edge.

According to the invention, the flat circuit is elastically deformable in the engaging direction of the connectors by forming the free end, and the mating connector can be tightly inserted until the mating connector is completely engaged with a stroke beyond an engaging stroke.

According to the second aspect of the invention, a position of the free end can be defined before the flat circuit is mounted. The free end can be engaged in the same manner as in the first aspect. A part not including the end edge can be fixed as a fixed part in the same manner as in the conventional structure.

DESCRIPTION OF THE PREFERRED EMBODIMENTS

Figure 1:
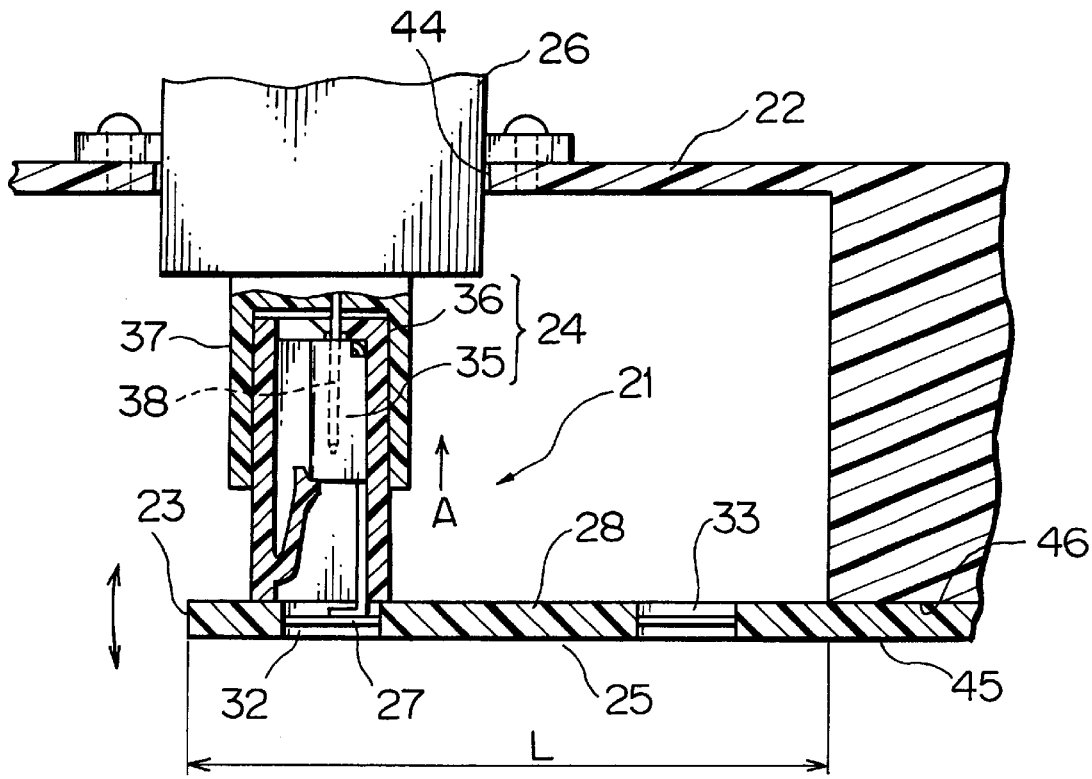
FIG. 1 is a sectional view showing an embodiment of a flat circuit according to the present invention.

A preferred embodiment according to the present invention will be described hereunder referring to the drawings.

In FIG. 1, reference numeral 21 designates a flat circuit which is arranged inside an instrument panel 22 of a vehicle such as an automobile. At a side including an end edge 23 of the flat circuit 21 is formed a free end 25 provided with a connector 24. By thus providing the free end 25 on the flat circuit 21, an electrical connection with an auxiliary component 26 to be mounted on the instrument panel 22 can be conducted favorably.

Figure 2:
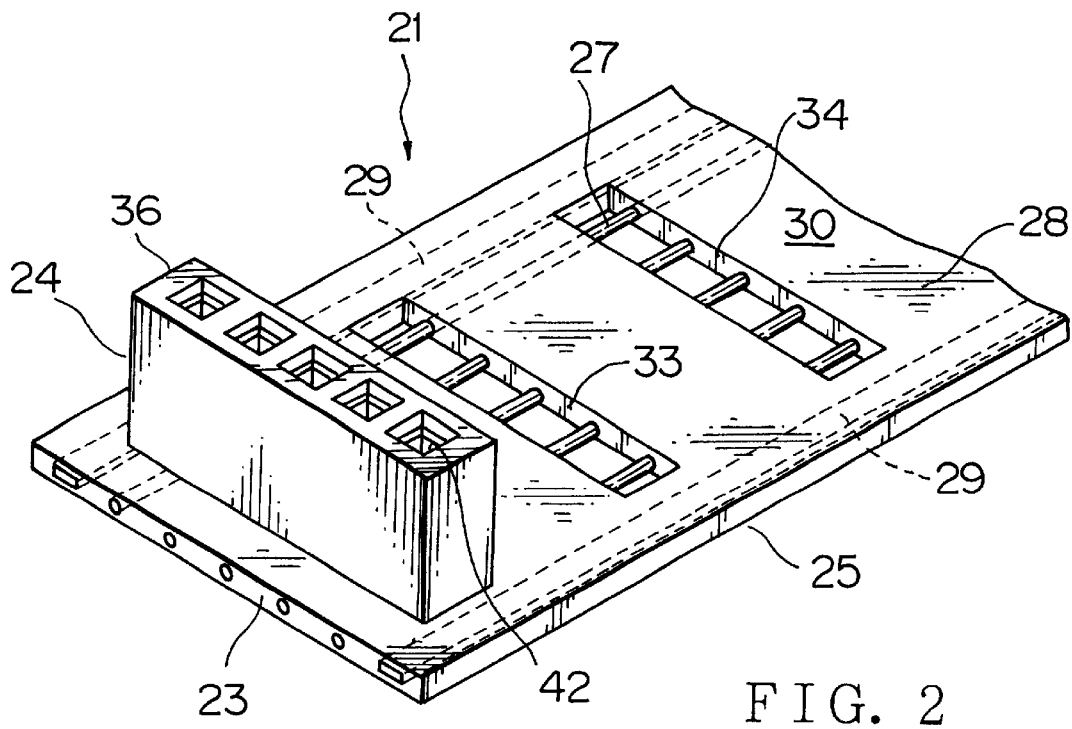
FIG. 2 is a perspective view of an outer appearance of the flat circuit of FIG. 1.
Figure 3:
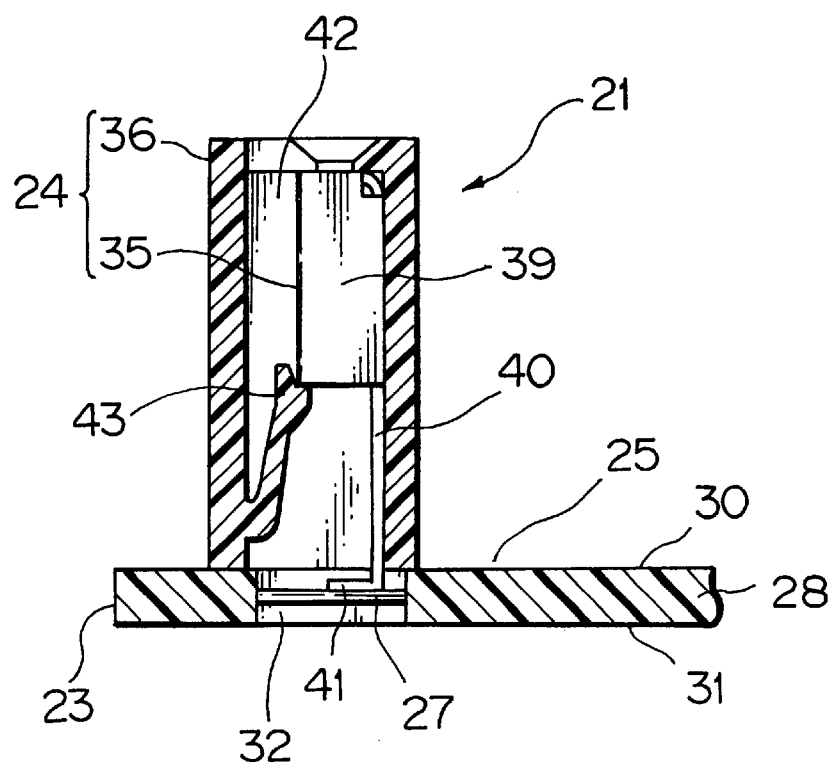
FIG. 3 is an enlarged view of an essential part of FIG. 1.
Figure 5:
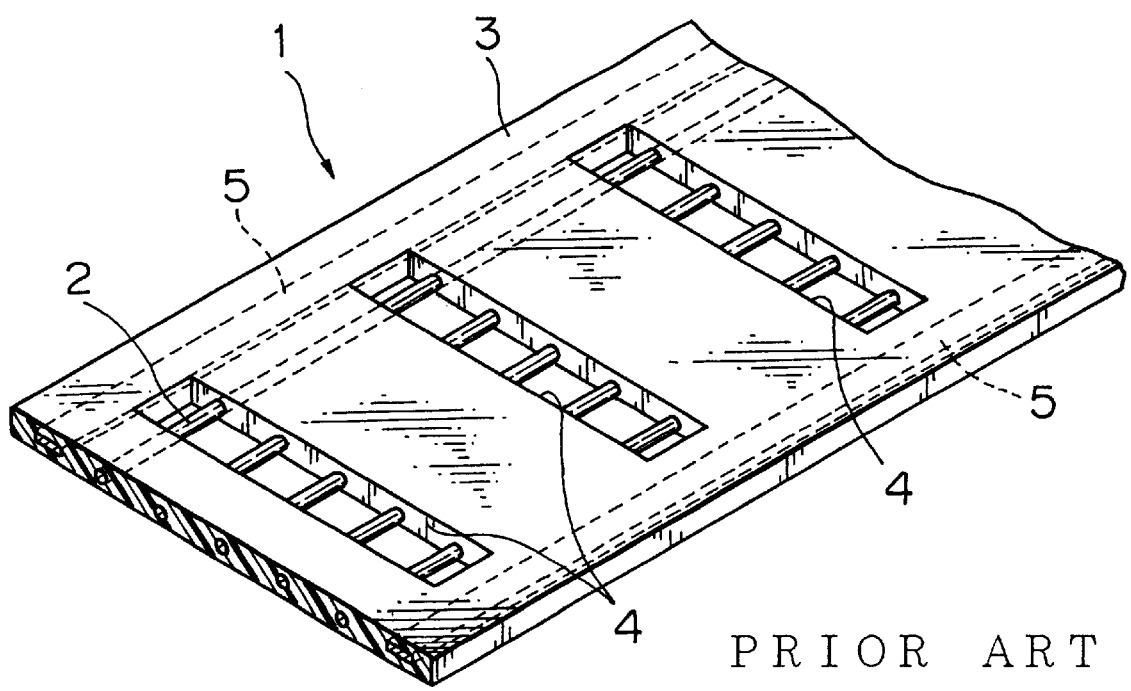
FIG. 5 is a perspective view of an outer appearance of a conventional flat circuit.

As shown in FIGS. 2 and 3, the flat circuit 21 which is deformable is composed of a plurality of conductors 27, an insulating covering 28 in a strip shape formed of insulating material so as to cover the conductors 27 by insert molding, and reinforcing members 29, 29 embedded in the insulating covering 28 on its both sides.

A plurality of the conductors 27 include five (not limited to this number) flexible electric wires and arranged in the insulating covering 28 in parallel to one another. A deformed shape of the flat circuit 21 can be maintained by bending the conductors 27. It is to be noted that the conductor 27 may be in a form of a busbar, besides such electric wires as shown in the drawings.

The insulating covering 28 is formed so as to extend in a direction of wiring the conductors 27 and provided with a plurality of conductor exposing windows 32, 33, 34 passing through a front and a rear faces 30 and 31. The conductor exposing windows 32, 33, 34 are arranged at desired distances (at an equal distance in this embodiment) from one another, and are open in a rectangular shape so as to partially expose the conductors 27 which are embedded in the insulating covering 28. The aforesaid connector 24 is provided on the front face 30 of the conductor exposing window 32.

The reinforcing member 29 has more rigidity than the conductor 27 and acts to protect the conductor 27 in case where the flat circuit 21 need to be bent many times. The reinforcing member 29 is not limited to a strip-like shape as shown in the drawings. It is optional to provide the reinforcing member 29.

The connector 24 is arranged on the front face 30 at the conductor exposing window 32 which is the closest to the end edge 23. The connector 24 consists of a plurality of (five in this embodiment) terminals 35 made of metal having high conductivity, and a connector housing 36 made of synthetic resin for containing the terminals 35.

Each of the terminals 35 is composed of a box-like electrical contact 39 into which a male terminal 38 (see FIG. 1) of a connector 37 provided on the auxiliary component 26 is adapted to be inserted, and a connecting portion 40 formed integrally with the electrical contact 39. A tip end of the connecting portion 40 is integrally provided with a welded lug 41 which is bent with respect to the tip end and adapted to be welded to the corresponding conductor 27.

The connector housing 36 is formed in a rectangular box-shape which opens in a vertical direction in FIG. 3, and provided with a plurality of terminal receiving chambers 42 for respectively receiving a plurality of the terminals 35 in a vertical direction. In each of the terminal receiving chambers 42, there is integrally formed a locking member 43 for locking the terminal 35 which is inserted from a bottom of the connector housing 36 and abutted against its upper end.

In the above described embodiment, the connector 24 is so constructed, as shown in FIG. 1, that after the terminal 35 is welded to the corresponding conductor 27 and fixed in a direction perpendicular to the wiring direction, the connector housing 36 is mounted on the front face 30 at the conductor exposing window 32 in the perpendicular direction.

The flat circuit 21 has the free end 25 extending for a length L (FIG. 1) in the wiring direction from the end edge 23. Owing to a plurality of the conductors 27 and the rigidity of the reinforcing members 29, 29 (FIG. 2), the free end 25 is elastically deformable in the perpendicular direction, that is, a direction of engagement between the connector 37 and the connector 24.

Therefore, even though the auxiliary component 26 is pushed into a fitting bole 44 formed in the instrument panel 22 until the connector 37 is completely engaged with the connector 24, the flat circuit 21 itself will not be broken or damaged. Moreover, when the auxiliary component 26 is mounted, a fixed part 45 of the flat circuit 21 will not be fallen off to damage a fixed part 46 of the instrument panel 22, because the free end 25 is elastically deformable.

Figure 4:
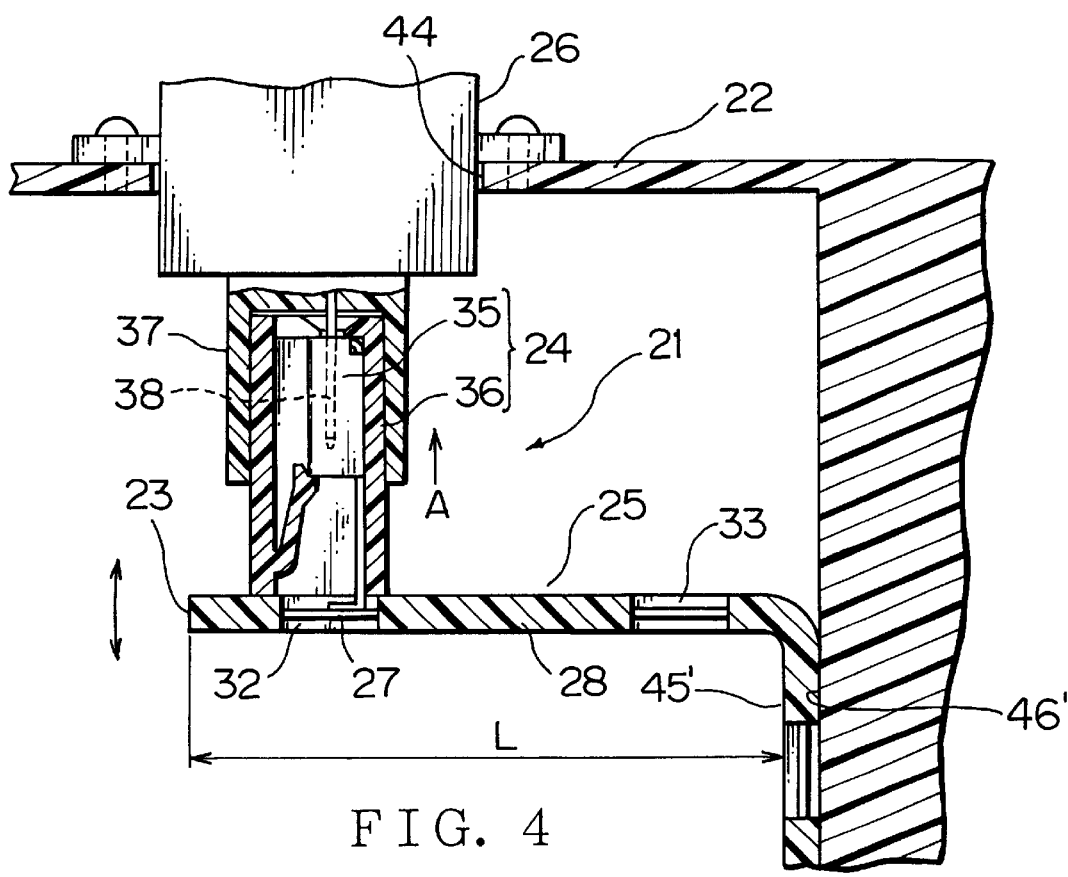
FIG. 4 is a sectional view showing another example of a free end.

The free end 25 can be formed by bending the flat circuit 21 at a position of the length L from the end edge 23 at an angle of about 90 degree as shown in FIG. 4. The bending angle is optional. In this case, it is advantageous that a position of the free end 25 can be defined before mounting the flat circuit 21.

Reference numeral 45' designates a fixed part which is essentially equal to the aforesaid fixed part 45, and 46' designates a fixed part similar to the aforesaid fixed part 46.

As described hereinabove referring to FIGS. 1 to 4, the auxiliary component 26 can be reliably mounted because the connector 24 is mounted on the free end 25 which is formed at the end edge 23 of the flat circuit 21. Moreover, the auxiliary component 26 is fixed and adapted to be engaged with the connector 24 with a rotating stroke of the connector 24. An arrow mark A represents a rebounding force.

In this manner, the flat circuit which can be reliably coupled to the mating connector can be realized.

It is apparent that various modifications can be made within a scope of the invention.

The above described insulating covering 28 is formed of the insulating material such as polypropylene, polyisobutylene, polyethylene, polyester, synthetic rubber, etc. The covering 28 may be in a form of a sheet so as to laminate the conductors 27.

The free end 25 may be provided with a plurality of the connectors 24. The described structure of the connector 24 is only one example. The connector 24 may be in any structure, provided that the mating connector like the aforesaid connector 37 can be engaged with the connector 24 in the aforesaid perpendicular direction.

Further, the method for mounting the connector 24 is not limited to the above described method. In addition to the above described method, various other methods such as an engagement by means of a projection and a hole, etc. can be conceived.

The flat circuit 21 can be arranged not only inside the instrument panel 22, but in a door trim or the like of the vehicle.

What is claimed is:

1. A combination of a flat circuit and a first connector, comprising:

a plurality of flexible linear conductors which are arranged in parallel to one another;

an insulating covering in a shape of a strip formed of insulating material so as to cover said conductors and extending in a direction of wiring said conductors, said flat circuit being deformable by bending said conductors;

a plurality of conductor exposing windows provided on at least either one of a front face and a rear face of said insulating covering at desired distances in said wiring direction, through which said conductors are adapted to be exposed a free end portion formed at one end side of said flat circuit, extending for a desired length from an end edge in said wiring direction and being elastically deformable; and said first connector provided on at least one of said conductor exposing windows located in said free end portion so that a mating connector can be engaged with said first connector;

wherein said first connector is provided with a connecting portion perpendicularly approaching the flexible linear conductors and includes at least one welding lug, at a distal end of the connecting portion, extending in parallel to, while contacting, a respective one of the flexible linear conductors.

2. The combination as claimed in claim 1, wherein said flat circuit is bent and deformed at a position of said desired length so as to form said free end portion at a side including said end edge.

3. The combination as claimed in claim 1, wherein the flat circuit comprises at least one reinforcing member.

4. A flat circuit which comprises:

a plurality of flexible conductors which are arranged in parallel to one another;

an insulating covering in a shape of a strip formed of insulating material so as to cover said conductors by insert molding and extending in a direction of wiring said conductors, said flat circuit being deformable by bending said conductors;

a plurality of conductor exposing parts provided on at least either one of a front face and a rear face of said insulating covering at desired distances in said wiring direction, through which said conductors are adapted to be exposed;

a free end formed at one end of said flat circuit and extending for a desired length from an end edge in said wiring direction so as to be elastically deformable in a direction perpendicular to said wiring direction; and a connector provided on at least one of said conductor exposing parts located in said free end so that a mating connector can be engaged with said connector in said perpendicular direction;

wherein said flat circuit is bent and deformed at a position of said desired length so as to form said free end at a side including said end edge.

* * * * *